United States Patent
Huang et al.

(10) Patent No.: US 11,837,600 B2
(45) Date of Patent: Dec. 5, 2023

(54) ELECTROSTATIC DISCHARGE PROTECTION APPARATUS AND ITS OPERATING METHOD

(71) Applicant: MACRONIX INTERNATIONAL CO., LTD., Hsinchu (TW)

(72) Inventors: Wen-Tsung Huang, Changhua County (TW); Shih-Yu Wang, Taipei (TW); Chih-Wei Hsu, Changhua County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 65 days.

(21) Appl. No.: 17/526,014

(22) Filed: Nov. 15, 2021

(65) Prior Publication Data

US 2023/0154920 A1  May 18, 2023

(51) Int. Cl.
*H01L 27/02* (2006.01)
*H01L 29/74* (2006.01)

(52) U.S. Cl.
CPC ...... *H01L 27/0262* (2013.01); *H01L 29/7436* (2013.01)

(58) Field of Classification Search
CPC ............. H01L 27/0262; H01L 29/7436; H01L 27/0266; H01L 29/74; H01L 29/083; H01L 29/0839; H01L 29/66393
See application file for complete search history.

(56) References Cited

U.S. PATENT DOCUMENTS

| | | | |
|---|---|---|---|
| 2003/0042498 A1* | 3/2003 | Ker | H01L 29/7436 257/361 |
| 2017/0069616 A1* | 3/2017 | Cai | H01L 27/0262 |
| 2020/0135715 A1* | 4/2020 | Loiseau | H01L 21/76224 |
| 2021/0066286 A1 | 3/2021 | Tsai et al. | |

FOREIGN PATENT DOCUMENTS

| | | |
|---|---|---|
| CN | 107017248 A | 8/2017 |
| TW | 201503313 A | 1/2015 |
| TW | 202111912 A | 3/2021 |

* cited by examiner

*Primary Examiner* — Wasiul Haider
(74) *Attorney, Agent, or Firm* — McClure, Qualey & Rodack, LLP

(57) ABSTRACT

The electrostatic discharge protection apparatus includes a substrate, a first well having a first conductivity type and disposed in the substrate, a second well having a second conductivity type and disposed in the first well, a first doping region having the first conductivity type and disposed in the second well, a second doping region having the first conductivity type and disposed in the second well, a third doping region having the second conductivity type and disposed in the second well, and a fourth doping region having the first conductivity type and disposed in the substrate. The first conductivity type is different from the second conductivity type. The second well, the first well, the substrate and the fourth doping region form a silicon controlled rectifier. Electrostatic discharge current flowing into the first doping region flows to the fourth doping region through the silicon controlled rectifier.

10 Claims, 3 Drawing Sheets

ELECTROSTATIC DISCHARGE PROTECTION APPARATUS AND ITS OPERATING METHOD

BACKGROUND

Technical Field

The present disclosure relates to a semiconductor integrated circuit (IC) and the applications thereof, and more particularly to an electrostatic discharge protection apparatus and its operating method.

Description of the Related Art

Electrostatic discharge (ESD) is a phenomenon of electrostatic charge transfer between two objects at different electric potentials. The ESD can generate a large current in a short period of time (typically within a few nanoseconds). When the large current generated by the ESD passes through a semiconductor integrated circuit in a short period of time, it can cause serious damage to the integrated circuit. The ESD has become one of the major causes of failures in the integrated circuits. How to develop an effective ESD protection design in integrated circuits is an important issue in the semiconductor manufacturing process.

Stacking low-voltage transistor devices to achieve a high-voltage ESD protection apparatus is a common ESD protection design. However, one major disadvantage of such stacked configuration is that the ESD protection apparatus has a large size. That is to say, the ESD protection apparatus with stacked low-voltage transistor devices needs a large layout area in the integrated circuit, thereby increasing manufacturing costs.

It is important to provide technology for electrostatic discharge protection apparatus with decreased layout area and improved electrostatic discharge protection ability.

SUMMARY

The present disclosure relates to an electrostatic discharge protection apparatus and a method for operating the same.

According to an embodiment of the present disclosure, an electrostatic discharge protection apparatus is provided. The electrostatic discharge protection apparatus includes a substrate, a first well having a first conductivity type and disposed in the substrate, a second well having a second conductivity type and disposed in the first well, a first doping region having the first conductivity type and disposed in the second well, a second doping region having the first conductivity type and disposed in the second well, a third doping region having the second conductivity type and disposed in the second well, and a fourth doping region having the first conductivity type and disposed in the substrate. The first conductivity type is different from the second conductivity type. The second well, the first well, the substrate and the fourth doping region form a silicon controlled rectifier (SCR). Electrostatic discharge current flowing into the first doping region flows to the fourth doping region through the SCR.

According to another embodiment of the present disclosure, an electrostatic discharge protection apparatus is provided. The electrostatic discharge protection apparatus includes a substrate, a first well having a first conductivity type and disposed in the substrate, a second well having a second conductivity type and disposed in the first well, a third well having a second conductivity type and disposed in the first well, a first doping region having the first conductivity type and disposed in the second well, a second doping region having the first conductivity type and disposed in the second well, a third doping region having the second conductivity type and disposed in the second well, and a fourth doping region having the first conductivity type and disposed in the third well. The first conductivity type is different from the second conductivity type. The second well, the first well, the third well and the fourth doping region form a SCR. Electrostatic discharge current flowing into the first doping region flows to the fourth doping region through the SCR.

According to yet another embodiment of the present disclosure, a method for operating an electrostatic discharge protection apparatus is provided. The method includes providing an electrostatic discharge protection apparatus electrically connected to an internal circuit. The electrostatic discharge protection apparatus includes a substrate, a first well having a first conductivity type and disposed in the substrate, a second well having a second conductivity type and disposed in the first well, a first doping region having the first conductivity type and disposed in the second well, a second doping region having the first conductivity type and disposed in the second well, a third doping region having the second conductivity type and disposed in the second well, and a fourth doping region having the first conductivity type and disposed in the substrate. The first conductivity type is different from the second conductivity type. The second well, the first well, the substrate and the fourth doping region form a SCR. The method further includes when the internal circuit is subjected to an electrostatic discharge stress, electrostatic discharge current flows through the SCR to direct the electrostatic discharge current away from the internal circuit.

The above and other embodiments of the disclosure will become better understood with regard to the following detailed description of the non-limiting embodiment(s). The following description is made with reference to the accompanying drawings.

DETAILED DESCRIPTION

Figure 1:
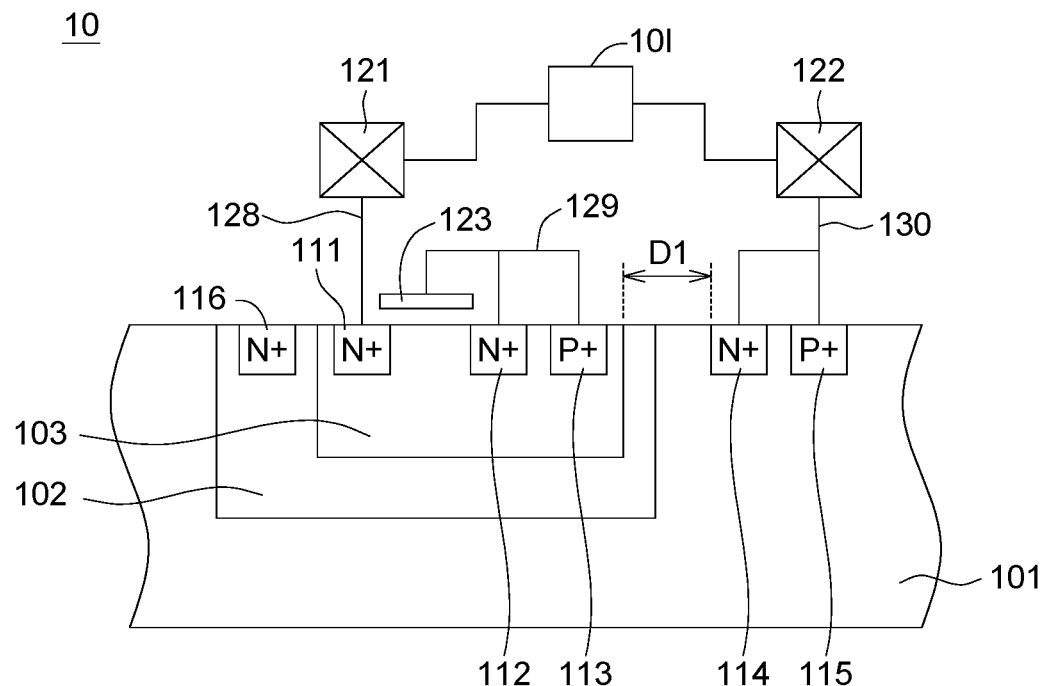
FIG. 1 illustrates a cross-sectional view of an electrostatic discharge protection apparatus according to a first embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

First Embodiment

Referring to FIG. 1. FIG. 1 illustrates a cross-sectional view of an electrostatic discharge protection apparatus 10 according to a first embodiment of the present disclosure. The electrostatic discharge protection apparatus 10 includes a substrate 101, a first well 102, a second well 103, a first doping region 111, a second doping region 112 and a third doping region 113.

In some embodiments of the present disclosure, the substrate 101 may be a doped or undoped semiconductor substrate, such as a silicon-containing substrate or a silicon-on-insulator (SOI) substrate. In the first embodiment, the substrate 101 is a P-type substrate.

The first well 102 is disposed in the substrate 101. The first well 102 has a first conductivity type. The second well 103 is disposed in the first well 102. The second well 103 has a second conductivity type. In an embodiment, the first well 102 and the second well 102 may be formed by using an ion implantation process. The depth of the first well 102 in the substrate 101 may be larger than the depth of the second well 103 in the substrate 101; the first well 102 may be understood as a deep well, and the second well 103 may be understood as a shallow well. The width of the first well 102 may be larger than the width of the second well 103. The first well 102 may surround the second well 103. The second well 103 is arranged in the profile area of the first well 102.

The first conductivity type is different from the second conductivity type. The first conductivity type may be opposite to the second conductivity type. In the first embodiment, the first conductivity type may be N-type, and the second conductivity type may be P-type. However, the present disclosure is not limited thereto.

The first doping region 111 is disposed in the second well 103. The first doping region 111 has the first conductivity type and a doping concentration (also referred to as N+) substantially larger than that of the first well 102 and/or the second well 103. The second doping region 112 is disposed in the second well 103. The second doping region 112 has the first conductivity type and a doping concentration (also referred to as N+) substantially larger than that of the first well 102 and/or the second well 103. The third doping region 113 is disposed in the second well 103. The third doping region 113 has the second conductivity type and a doping concentration (also referred to as P+) substantially larger than that of the first well 102 and/or the second well 103. As shown in FIG. 1, the second doping region 112 is between the first doping region 111 and the third doping region 113. The first doping region 111, the second doping region 112 and the third doping region 113 may be separated from each other.

The electrostatic discharge protection apparatus 10 may further include a contact pad 121, a gate structure 123, a metal wire 128 and a metal wire 129. The first doping region 111 may be electrically connected to the contact pad 121 through the metal wire 128. The gate structure 123 is on the substrate 101 between the first doping region 111 and the second doping region 112. The second doping region 112 and the third doping region 113 may be electrically connected to the gate structure 123 through the metal wire 129. The second doping region 112 may be electrically connected to the third doping region 113 through the metal wire 129. In an embodiment, the first doping region 111, the second doping region 112, the gate structure 123 and the second well 103 form a N-type metal-oxide-semiconductor field-effect transistor (NMOSFET), and the first doping region 111 and the second doping region 112 may function as source/drain side doping regions of the NMOSFET. The first doping region 111 may also referred to as a first source/drain side doping region of the NMOSFET, and the second doping region 112 may also referred to as a second source/drain side doping region of the NMOSFET.

The electrostatic discharge protection apparatus 10 may further include a fourth doping region 114, a fifth doping region 115, a contact pad 122 and a metal wire 130. Both the fourth doping region 114 and the fifth doping region 115 are disposed in the substrate 101. The fourth doping region 114 has the first conductivity type and a doping concentration (also referred to as N+) substantially larger than that of the first well 102 and/or the second well 103. The fifth doping region 115 has the second conductivity type and a doping concentration (also referred to as P+) substantially larger than that of the first well 102 and/or the second well 103. The fourth doping region 114 and the fifth doping region 115 may be electrically connected to the contact pad 122 through the metal wire 130. In an embodiment, the fourth doping region 114 and the fifth doping region 115 is connected to the ground. The fifth doping region 115 may function as a pickup. The fourth doping region 114 and the fifth doping region 115 may be separated from each other. In an embodiment, there is a distance D1 between the second well 103 and the fourth doping region 114. The distance D1 may be defined as a minimum distance between the second well 103 and the fourth doping region 114. In an embodiment, as shown in FIG. 1, the distance D1 may represent a distance between a boundary of the second well 103 and a boundary of the fourth doping region 114 along a direction parallel to an upper surface of the substrate 101. The distance D1 may be less than 20 micrometers (μm).

The electrostatic discharge protection apparatus 10 may further include a sixth doping region 116. The sixth doping region 116 is disposed in the first well 102. The sixth doping region 116 has the first conductivity type and a doping concentration (also referred to as N+) substantially larger than that of the first well 102 and/or the second well 103. The doping concentrations of the first doping region 111, the second doping region 112, the third doping region 113, the fourth doping region 114, the fifth doping region 115 and the sixth doping region 116 may be similar or different.

In an embodiment, the electrostatic discharge protection apparatus 10 may be used to protect an internal circuit 10I in the integrated circuit so as to prevent the internal circuit 10I from being damaged by the electrostatic discharge current. The internal circuit 10I may be electrically connected to the contact pad 121 of the electrostatic discharge protection apparatus 10. When the internal circuit 10I is subjected to an electrostatic discharge stress, the electrostatic discharge protection apparatus directs the electrostatic discharge current away from the internal circuit 10I. The electrostatic discharge current flows into the electrostatic discharge protection apparatus 10 from the contact pad 121 and then flows into the first doping region 111 through the metal wire 128. The electrostatic discharge current sequentially flows through the first doping region 111, the second well 103, the second doping region 112, the third doping region 113 and the fourth doping region 114, and then flows to the ground or the contact pad 122. Specifically, when the internal circuit 10I is subjected to an electrostatic discharge stress, the electrostatic discharge current flows into the first doping region 111 from the contact pad 121, passes through a PN junction between the first doping region 111 and the second well 103 and flows into the second well 103. Then, the electrostatic discharge current passes through a PN junction between the second well 103 and the second doping region 112 and flows into the second doping region 112. Then, the electrostatic discharge current flows into the third doping region 113 through the metal wire 129. Then, the electrostatic discharge current flows into the second well 103 from the third doping region 113. Then, the electrostatic discharge current passes through a PN junction between the second well 103 and the first well 102 and flows into the first well 102. Then, the electrostatic discharge current passes through a PN junction between the first well 102 and the substrate 101 and flows into the substrate 101. Then, the electrostatic discharge current passes through a PN junction between the substrate 101 and the fourth doping region 114 and flows into the fourth doping region 114. After that, the electrostatic discharge current flows to the ground or the contact pad 122 from the fourth doping region 114 through the metal wire 130. When the internal circuit 10I is subjected to an electrostatic discharge stress, the first well 102 may remain in a floating state.

The second well 103, the first well 102 and the substrate 101 are integrated to form a PNP bipolar junction transistor (BJT) having P-type majority carriers. The first well 102, the substrate 101 and the fourth doping region 114 are integrated to form a NPN BJT having N-type majority carriers. The collector of the PNP BJT is connected to the base of the NPN BJT. The base of the PNP BJT is connected to the collector of the NPN BJT, whereby a SCR is formed in the electrostatic discharge protection apparatus 10. The second well 103 may function as the anode of the SCR, and the fourth doping region 114 may function as the cathode of the SCR within the electrostatic discharge protection apparatus 10. When an internal circuit 10I electrically connected to the electrostatic discharge protection apparatus 10 is subjected to an electrostatic discharge stress, electrostatic discharge current flowing into the first doping region 111 flows to the fourth doping region 114 through the SCR so as to keep the electrostatic discharge current away from the internal circuit 10I.

Second Embodiment

Figure 2:
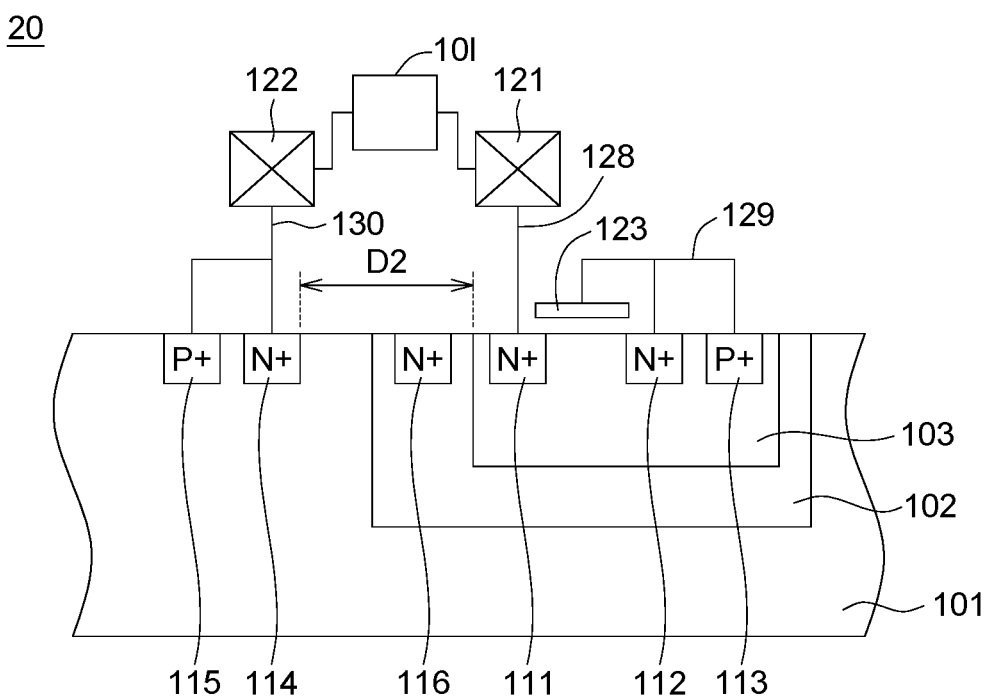
FIG. 2 illustrates a cross-sectional view of an electrostatic discharge protection apparatus according to a second embodiment of the present disclosure.

Referring to FIG. 2. FIG. 2 illustrates a cross-sectional view of an electrostatic discharge protection apparatus 20 according to a second embodiment of the present disclosure. The second embodiment is different from the first embodiment in that the positions of the fourth doping region 114 and the fifth doping region 115 of the electrostatic discharge protection apparatus 20 relative to the NMOSFET are different. Specifically, the fourth doping region 114 and the fifth doping region 115 are on a side near the first doping region 111 in the electrostatic discharge protection apparatus 20, while the fourth doping region 114 and the fifth doping region 115 are on a side near the third doping region 113 in the electrostatic discharge protection apparatus 10.

In this embodiment, there is a distance D2 between the second well 103 and the fourth doping region 114. The distance D2 may be defined as a minimum distance between the second well 103 and the fourth doping region 114. As shown in FIG. 2, the distance D2 may represent a distance between a boundary of the second well 103 and a boundary of the fourth doping region 114 along a direction parallel to an upper surface of the substrate 101. The distance D2 may be less than 20 micrometers.

When the electrostatic discharge protection apparatus 20 is used to protect the internal circuit 10I in the integrated circuit, the internal circuit 10I may be electrically connected to the contact pad 121 of the electrostatic discharge protection apparatus 20. When the internal circuit 10I is subjected to an electrostatic discharge stress, the electrostatic discharge path in the electrostatic discharge protection apparatus 20 is the same as the electrostatic discharge path in the electrostatic discharge protection apparatus 10. The first well 102 may remain in a floating state. The second well 103, the first well 102, the substrate 101 and the fourth doping region 114 form a SCR in the electrostatic discharge protection apparatus 20. The second well 103 may function as the anode of the SCR, and the fourth doping region 114 may function as the cathode of the SCR within the electrostatic discharge protection apparatus 20. When an internal circuit 10I electrically connected to the electrostatic discharge protection apparatus 20 is subjected to an electrostatic discharge stress, electrostatic discharge current flowing into the first doping region 111 flows to the fourth doping region 114 through the SCR so as to keep the electrostatic discharge current away from the internal circuit 10I.

Third Embodiment

Figure 3:
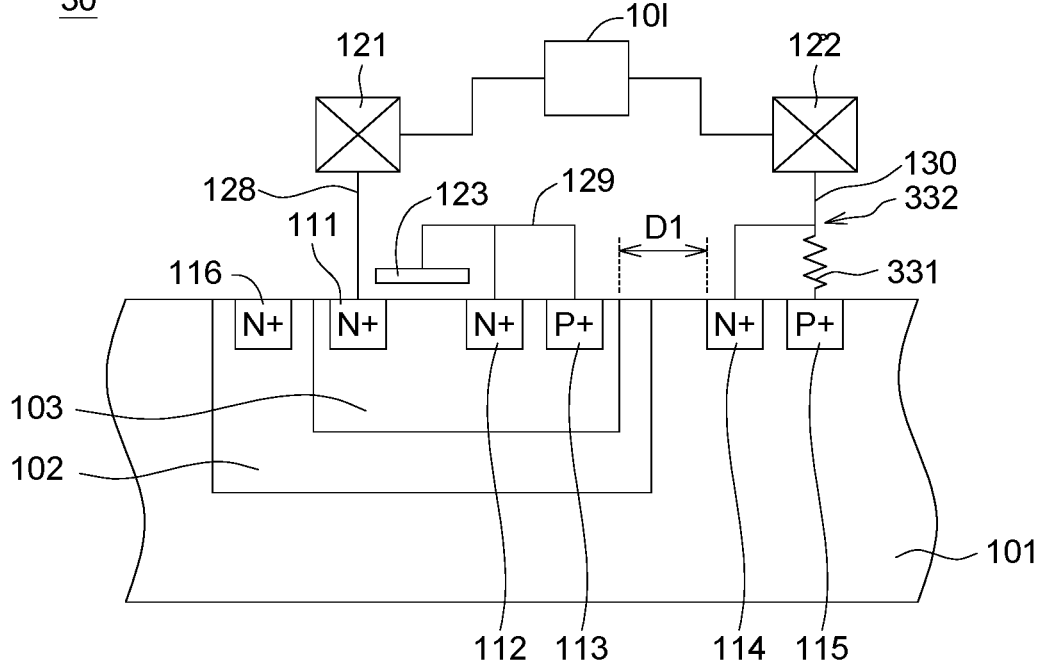
FIG. 3 illustrates a cross-sectional view of an electrostatic discharge protection apparatus according to a third embodiment of the present disclosure.

Referring to FIG. 3. FIG. 3 illustrates a cross-sectional view of an electrostatic discharge protection apparatus 30 according to a third embodiment of the present disclosure. The third embodiment is different from the first embodiment in that the electrostatic discharge protection apparatus 30 further includes a resistor 331 electrically connected to the fifth doping region 115. The fourth doping region 114 is electrically connected to a node 332 between the resistor 331 and the contact pad 122.

When the electrostatic discharge protection apparatus 30 is used to protect the internal circuit 10I in the integrated circuit, the internal circuit 10I may be electrically connected to the contact pad 121 of the electrostatic discharge protection apparatus 30. When the internal circuit 10I is subjected to an electrostatic discharge stress, the electrostatic discharge path in the electrostatic discharge protection apparatus 30 is the same as the electrostatic discharge path in the electrostatic discharge protection apparatus 10. The first well 102 may remain in a floating state. The second well 103, the first well 102, the substrate 101 and the fourth doping region 114 form a SCR in the electrostatic discharge protection apparatus 30. The second well 103 may function as the anode of the SCR, and the fourth doping region 114 may function as the cathode of the SCR within the electrostatic discharge protection apparatus 30. When an internal circuit 10I electrically connected to the electrostatic discharge protection apparatus 30 is subjected to an electrostatic discharge stress, electrostatic discharge current flowing into the first doping region 111 flows to the fourth doping region 114 through the SCR so as to keep the electrostatic discharge current away from the internal circuit 10I.

Fourth Embodiment

Figure 4:
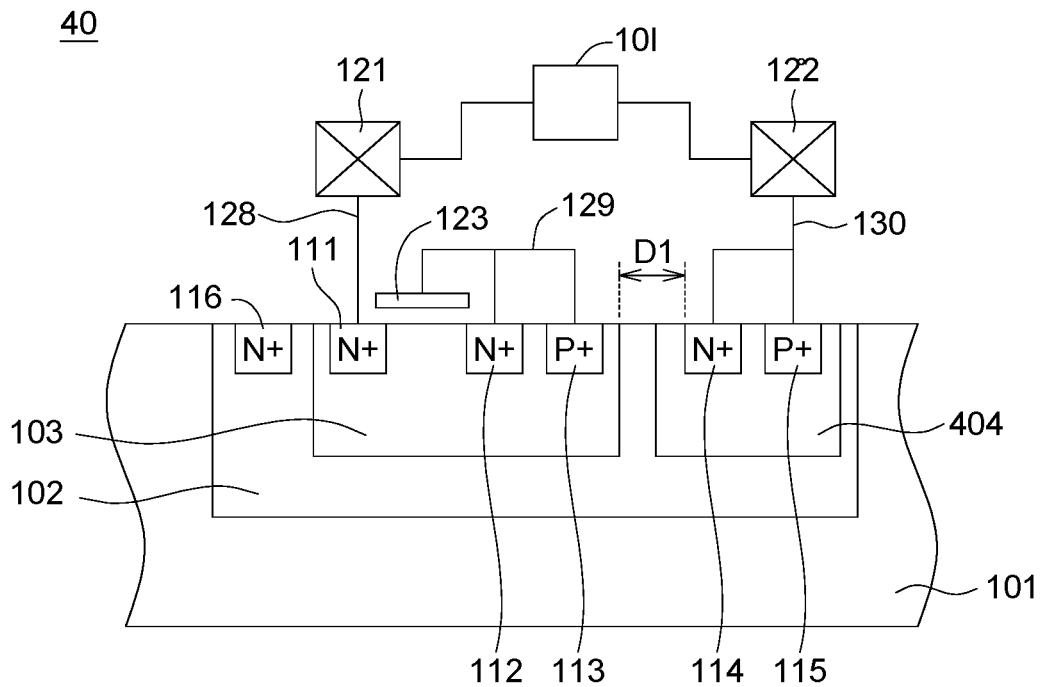
FIG. 4 illustrates a cross-sectional view of an electrostatic discharge protection apparatus according to a fourth embodiment of the present disclosure.

Referring to FIG. 4. FIG. 4 illustrates a cross-sectional view of an electrostatic discharge protection apparatus 40 according to a fourth embodiment of the present disclosure. The fourth embodiment is different from the first embodiment in that the electrostatic discharge protection apparatus 40 further includes a third well 404 having the second conductivity type. Both the second well 103 and the third well 404 are disposed in the first well 102. Both the fourth doping region 114 and the fifth doping region 115 are disposed in the third well 404. In an embodiment, the third well 404 may be formed by using an ion implantation process. The third well 404 may have a doping concentration similar to the doping concentration of the second well 103. The second well 103 and the third well 404 may be separated from each other. In an embodiment, a lateral distance D1 between the third doping region 113 and the fourth doping region 114 may be less than 20 micrometers.

The depth of the first well 102 in the substrate 101 may be larger than the depths of the second well 103 and the third well 404 in the substrate 101; the first well 102 may be understood as a deep well, and the second well 103 and the third well 404 may be understood as shallow wells. The width of the first well 102 may be larger than the widths of the second well 103 and the third well 404. The first well 102 may surround the second well 103 and the third well 404. Both the second well 103 and the third well 404 may be arranged in the profile area of the first well 102.

When the electrostatic discharge protection apparatus 40 is used to protect the internal circuit 10I in the integrated circuit, the internal circuit 10I may be electrically connected to the contact pad 121 of the electrostatic discharge protection apparatus 40. When the internal circuit 10I is subjected to an electrostatic discharge stress, the electrostatic discharge current flows into the electrostatic discharge protection apparatus 40 from the contact pad 121 and then flows into the first doping region 111 through the metal wire 128. The electrostatic discharge current sequentially flows through the first doping region 111, the second well 103, the second doping region 112, the third doping region 113 and the fourth doping region 114, and then flows to the ground or the contact pad 122. Specifically, when the internal circuit 10I is subjected to an electrostatic discharge stress, the electrostatic discharge current flows into the first doping region 111 from the contact pad 121, passes through a PN junction between the first doping region 111 and the second well 103 and flows into the second well 103. Then, the electrostatic discharge current passes through a PN junction between the second well 103 and the second doping region 112 and flows into the second doping region 112. Then, the electrostatic discharge current flows into the third doping region 113 through the metal wire 129. Then, the electrostatic discharge current flows into the second well 103 from the third doping region 113. Then, the electrostatic discharge current passes through a PN junction between the second well 103 and the first well 102 and flows into the first well 102. Then, the electrostatic discharge current passes through a PN junction between the first well 102 and the third well 404 and flows into the third well 404. Then, the electrostatic discharge current passes through a PN junction between the third well 404 and the fourth doping region 114 and flows into the fourth doping region 114. After that, the electrostatic discharge current flows to the ground or the contact pad 122 from the fourth doping region 114 through the metal wire 130. When the internal circuit 10I is subjected to an electrostatic discharge stress, the first well 102 may remain in a floating state.

The second well 103, the first well 102 and the third well 404 are integrated to form a PNP BJT having P-type majority carriers. The first well 102, the third well 404 and the fourth doping region 114 are integrated to form a NPN BJT having N-type majority carriers. The collector of the PNP BJT is connected to the base of the NPN BJT. The base of the PNP BJT is connected to the collector of the NPN BJT, whereby a SCR is formed in the electrostatic discharge protection apparatus 40. The second well 103 may function as the anode of the SCR, and the fourth doping region 114 may function as the cathode of the SCR within the electrostatic discharge protection apparatus 40. When an internal circuit 10I electrically connected to the electrostatic discharge protection apparatus 40 is subjected to an electrostatic discharge stress, electrostatic discharge current flowing into the first doping region 111 flows to the fourth doping region 114 through the SCR so as to keep the electrostatic discharge current away from the internal circuit 10I.

Fifth Embodiment

Figure 5:
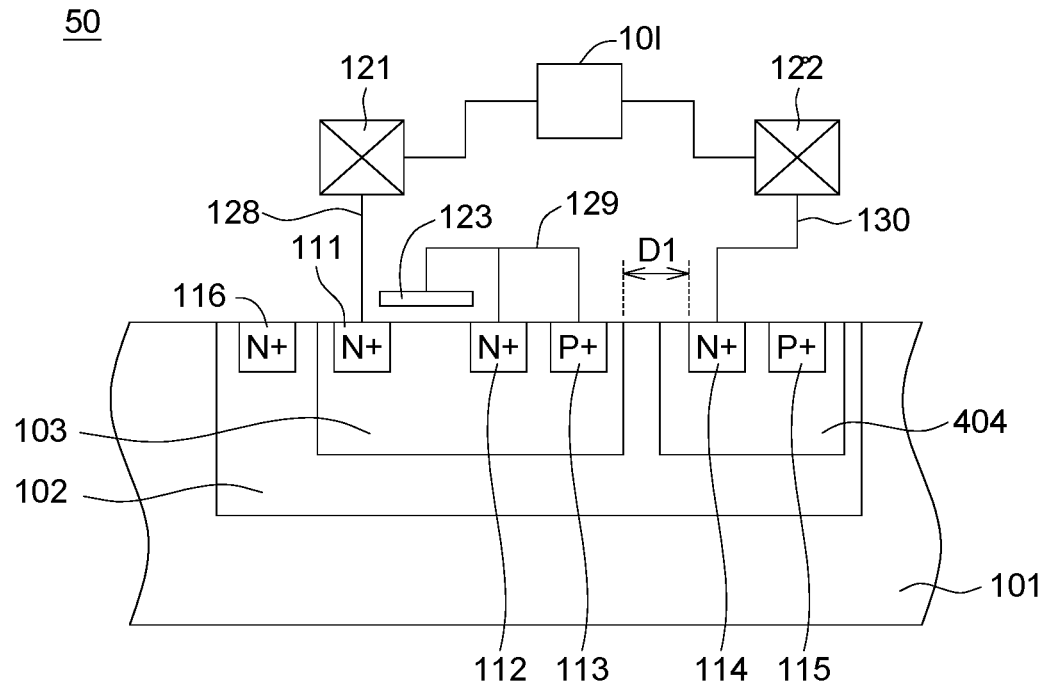
FIG. 5 illustrates a cross-sectional view of an electrostatic discharge protection apparatus according to a fifth embodiment of the present disclosure.

Referring to FIG. 5. FIG. 5 illustrates a cross-sectional view of an electrostatic discharge protection apparatus 50 according to a fifth embodiment of the present disclosure. The fifth embodiment is different from the fourth embodiment in that the fifth doping region 115 of the electrostatic discharge protection apparatus 50 is not electrically connected to the contact pad 122. The metal wire 130 of the electrostatic discharge protection apparatus 50 is not electrically connected to the fifth doping region 115.

When the electrostatic discharge protection apparatus 50 is used to protect the internal circuit 10I in the integrated circuit, the internal circuit 10I may be electrically connected to the contact pad 121 of the electrostatic discharge protection apparatus 50. When the internal circuit 10I is subjected to an electrostatic discharge stress, the electrostatic discharge path in the electrostatic discharge protection apparatus 50 is the same as the electrostatic discharge path in the electrostatic discharge protection apparatus 40. The first well 102 and the third well 404 may remain in floating states. The second well 103, the first well 102, the third well 404 and the fourth doping region 114 form a SCR in the electrostatic discharge protection apparatus 50. The second well 103 may function as the anode of the SCR, and the fourth doping region 114 may function as the cathode of the SCR within the electrostatic discharge protection apparatus 50. When an internal circuit 10I electrically connected to the electrostatic discharge protection apparatus 50 is subjected to an electrostatic discharge stress, electrostatic discharge current flowing into the first doping region 111 flows to the fourth doping region 114 through the SCR so as to keep the electrostatic discharge current away from the internal circuit 10I.

Sixth Embodiment

Figure 6:
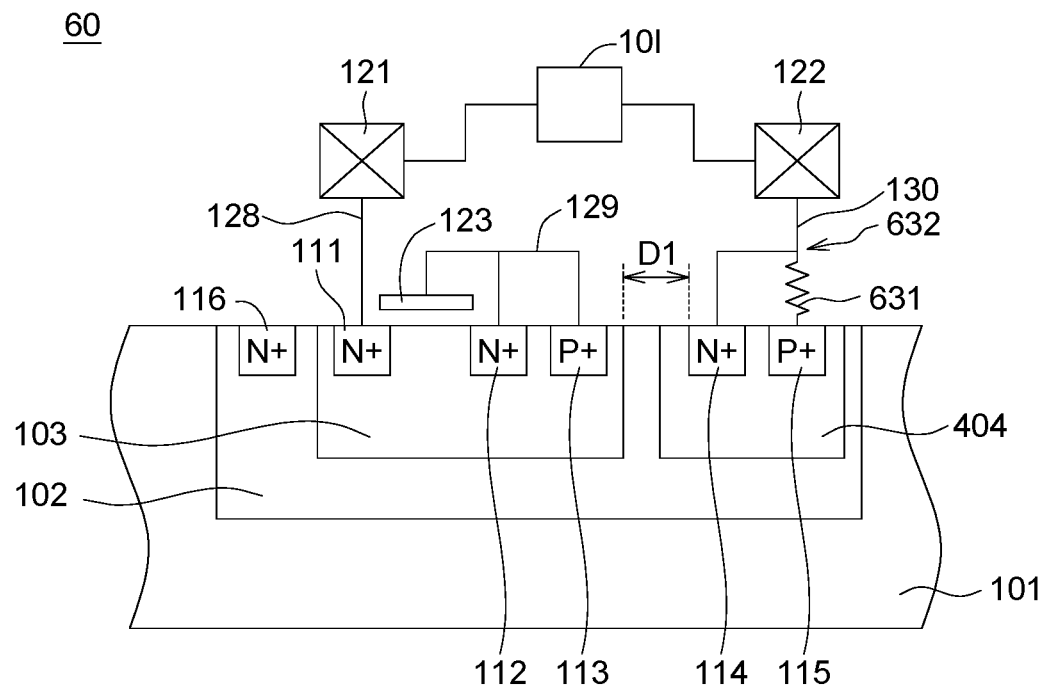
FIG. 6 illustrates a cross-sectional view of an electrostatic discharge protection apparatus according to a sixth embodiment of the present disclosure.

Referring to FIG. 6. FIG. 6 illustrates a cross-sectional view of an electrostatic discharge protection apparatus 60 according to a sixth embodiment of the present disclosure. The sixth embodiment is different from the fourth embodiment in that the electrostatic discharge protection apparatus 60 further includes a resistor 631 electrically connected to the fifth doping region 115. The fourth doping region 114 is electrically connected to a node 632 between the resistor 631 and the contact pad 122.

When the electrostatic discharge protection apparatus 60 is used to protect the internal circuit 10I in the integrated circuit, the internal circuit 10I may be electrically connected to the contact pad 121 of the electrostatic discharge protection apparatus 60. When the internal circuit 10I is subjected to an electrostatic discharge stress, the electrostatic discharge path in the electrostatic discharge protection apparatus 60 is the same as the electrostatic discharge path in the electrostatic discharge protection apparatus 40. The first well 102 may remain in a floating state. The second well 103, the first well 102, the third well 404 and the fourth doping region 114 form a SCR in the electrostatic discharge protection apparatus 60. The second well 103 may function as the anode of the SCR, and the fourth doping region 114 may function as the cathode of the SCR within the electrostatic discharge protection apparatus 60. When an internal circuit 10I electrically connected to the electrostatic discharge protection apparatus 60 is subjected to an electrostatic discharge stress, electrostatic discharge current flowing into the first doping region 111 flows to the fourth doping region 114 through the SCR so as to keep the electrostatic discharge current away from the internal circuit 10I.

The electrostatic discharge protection apparatus according to an embodiment of the present disclosure may include a NMOSFET, and the NMOSFET may be a low-voltage NMOSFET or a medium-voltage NMOSFET. The electrostatic discharge protection apparatus according to an embodiment of the present disclosure may be a high-voltage electrostatic discharge protection apparatus.

The present disclosure provides an electrostatic discharge protection apparatus including a NMOSFET and a doping region 114 (e.g. the electrostatic discharge protection apparatuses 10, 20, 30, 40, 50 and 60). With the configuration of a NMOSFET and a doping region 114, the electrostatic discharge protection apparatus according to the present disclosure has a smaller layout area and stronger electrostatic discharge protection ability as compared with the traditional high-voltage electrostatic discharge protection apparatus formed by stacking low-voltage transistors. The present disclosure provides an electrostatic discharge protection apparatus including SCR (e.g. the electrostatic discharge protection apparatuses 10, 20, 30, 40, 50 and 60), and thus the electrostatic discharge protection apparatus according to the present disclosure has a stronger electrostatic discharge protection ability as compared with the electrostatic discharge protection apparatus including one of NMOSFET, PNP bipolar junction transistor and NPN bipolar junction transistor. In some embodiments, the electrostatic discharge protection apparatus includes more than one wells in floating states (for example, the electrostatic discharge protection apparatus 50 shown in FIG. 5 includes the first well 102 and the third well 404 in floating states) when the internal circuit electrically connected to the electrostatic discharge protection apparatus is subjected to an electrostatic discharge stress; with such configurations, the electrostatic discharge protection apparatus has stronger electrostatic discharge protection ability as compared with the electrostatic discharge protection apparatus including only one well in a floating state. Therefore, with the use of the electrostatic discharge protection apparatus provided by the present disclosure, the electrostatic discharge current can be directed away from the internal circuit effectively, the reliability of the integrated circuits can be improved, the area efficiency of the integrated circuits can be improved, and the cost for manufacturing integrated circuits can be reduced.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge protection apparatus, comprising:
   a substrate;
   a first well having a first conductivity type and disposed in the substrate;
   a second well having a second conductivity type and disposed in the first well;
   a first doping region having the first conductivity type and disposed in the second well;
   a second doping region having the first conductivity type and disposed in the second well;
   a third doping region having the second conductivity type and disposed in the second well; and
   a fourth doping region having the first conductivity type and disposed in the substrate,
   wherein the first conductivity type is different from the second conductivity type; the second well, the first well, the substrate and the fourth doping region form a silicon controlled rectifier; electrostatic discharge current flowing into the first doping region flows to the fourth doping region through the silicon controlled rectifier.

2. The electrostatic discharge protection apparatus according to claim 1, wherein the first conductivity type is N type, and the second conductivity type is P type.

3. The electrostatic discharge protection apparatus according to claim 1, wherein the first doping region, the second doping region and the third doping region are separated from each other.

4. The electrostatic discharge protection apparatus according to claim 1, further comprising a contact pad electrically connected to the fourth doping region.

5. The electrostatic discharge protection apparatus according to claim 4, further comprising a fifth doping region having the second conductivity type and disposed in the substrate.

6. The electrostatic discharge protection apparatus according to claim 5, further comprising a resistor electrically connected to the fifth doping region, wherein the fourth doping region is electrically connected to a node between the resistor and the contact pad.

7. The electrostatic discharge protection apparatus according to claim 1, further comprising a metal wire, the second doping region is electrically connected to the third doping region through the metal wire.

8. A method for operating an electrostatic discharge protection apparatus, comprising:
   providing the electrostatic discharge protection apparatus electrically connected to an internal circuit, the electrostatic discharge protection apparatus comprising:
   a substrate;
   a first well having a first conductivity type and disposed in the substrate;

a second well having a second conductivity type and disposed in the first well;

a first doping region having the first conductivity type and disposed in the second well;

a second doping region having the first conductivity type and disposed in the second well;

a third doping region having the second conductivity type and disposed in the second well; and a fourth doping region having the first conductivity type and disposed in the substrate, wherein the first conductivity type is different from the second conductivity type; the second well, the first well, the substrate and the fourth doping region form a silicon controlled rectifier, when the internal circuit is subjected to an electrostatic discharge stress, electrostatic discharge current flows through the silicon controlled rectifier to direct the electrostatic discharge current away from the internal circuit.

9. The method according to claim 8, wherein the electrostatic discharge current sequentially flows through the first doping region, the second well, the second doping region, the third doping region, the second well, the first well, the substrate and the fourth doping region to a ground.

10. The method according to claim 9, wherein the electrostatic discharge protection apparatus further comprises a metal wire, the electrostatic discharge current flows to the third doping region from the second doping region through the metal wire.

* * * * *